United States Patent
Green

(10) Patent No.: US 6,712,132 B1
(45) Date of Patent: Mar. 30, 2004

(54) PIEZOELECTRIC WAFER CLAMPING SYSTEM

(76) Inventor: Revvie A. Green, 5309 Elm St., Colleyville, TX (US) 76034

( * ) Notice: Subject to any disclaimer, the term of this patent is extended or adjusted under 35 U.S.C. 154(b) by 310 days.

(21) Appl. No.: 10/006,866

(22) Filed: Oct. 26, 2001

(51) Int. Cl.[7] .............................................. F28F 27/00
(52) U.S. Cl. ...................... 165/200; 165/80.1; 165/47; 310/311; 269/21
(58) Field of Search ..................... 165/200, 47, 80.1; 310/311, 328; 269/21, 22

(56) References Cited

U.S. PATENT DOCUMENTS

| | | | |
|---|---|---|---|
| 3,578,994 A | 5/1971 | Massa | |
| 4,504,045 A | 3/1985 | Kenbo et al. | |
| 4,506,184 A | 3/1985 | Siddall | |
| 4,528,451 A | 7/1985 | Petric et al. | |
| 5,094,536 A | 3/1992 | MacDonald et al. | |
| 5,493,165 A | * 2/1996 | Smith et al. | 310/328 |
| 5,724,121 A | 3/1998 | McKinley et al. | |
| 6,389,677 B1 | * 5/2002 | Lenz | 29/559 |
| 6,445,109 B2 | * 9/2002 | Per.cedilla.in et al. | 310/324 |
| 6,597,434 B2 | * 7/2003 | Van Dijsseldonk | 355/75 |
| 6,606,426 B2 | * 8/2003 | Laor | 385/16 |

* cited by examiner

Primary Examiner—Terrell McKinnon

(57) ABSTRACT

A piezoelectric wafer clamping system for securing semiconductor wafers during the integrated circuit manufacturing processes. The piezoelectric wafer clamping system includes a plurality of piezoelectric stack assemblies designed for providing a real time adjustable vertical clamping force to a semiconductor wafer, an annular wafer clamp member coupled to each one of the plurality of piezoelectric stack assemblies and positionable to abut a top surface of a semiconductor wafer, a wafer support assembly designed for supporting the semiconductor wafer during processing, and a control assembly to monitor and compare actual cooling gas process parameters with preset process chamber parameters and electronically regulate a vertical clamping force applied by the plurality of the piezoelectric stack assemblies.

14 Claims, 4 Drawing Sheets

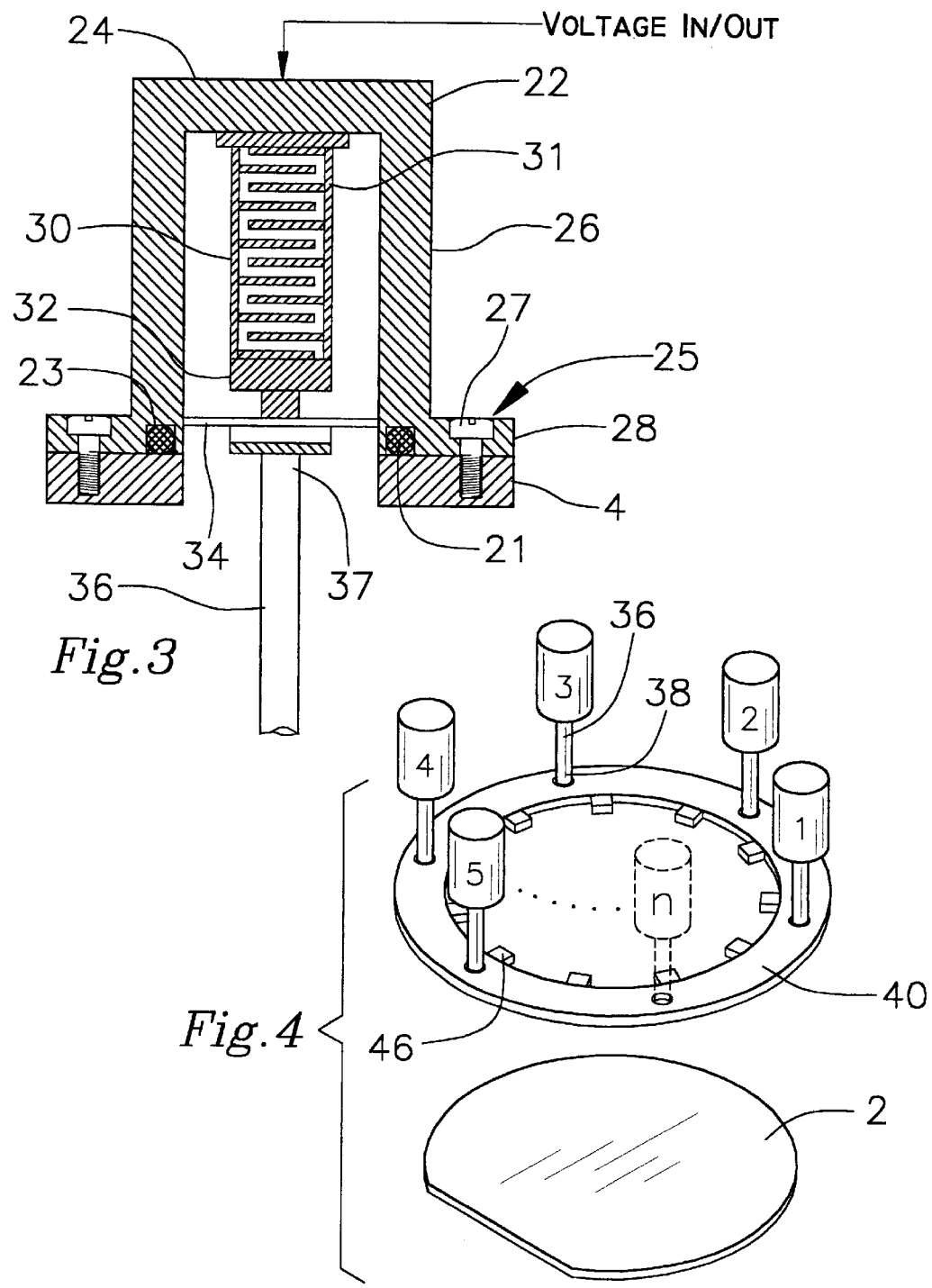

PIEZOELECTRIC WAFER CLAMPING SYSTEM

BACKGROUND OF THE INVENTION

1. Field of the Invention

The present invention relates to clamping devices and more particularly pertains to a new piezoelectric wafer clamping system for securing semiconductor wafers during the integrated circuit manufacturing processes.

2. Description of the Prior Art

The use of clamping devices is known in the prior art. More specifically, clamping devices heretofore devised and utilized are known to consist basically of familiar, expected and obvious structural configurations, notwithstanding the myriad of designs encompassed by the crowded prior art which have been developed for the fulfillment of countless objectives and requirements.

Known prior art includes U.S. Pat. Nos. 3,578,994; 4,504,045; 4,506,184; 5,724,121; 4,528,451; and 5,094,536.

While these devices fulfill their respective, particular objectives and requirements, the aforementioned patents do not disclose a new piezoelectric wafer clamping system. The inventive device includes a plurality of piezoelectric stack assemblies designed for providing a vertical clamping force to a semiconductor wafer, an annular wafer clamp member coupled to each one of the plurality of piezoelectric stack assemblies and positionable to abut a top surface of a semiconductor wafer, a wafer support assembly designed for supporting the semiconductor wafer during processing, and a control assembly designed to monitor and compare actual cooling gas process parameters with preset process parameters and electronically regulate a vertical clamping force applied by the plurality of the piezoelectric stack assemblies.

In these respects, the piezoelectric wafer clamping system according to the present invention substantially departs from the conventional concepts and designs of the prior art, and in so doing provides an apparatus primarily developed for the purpose of securing semiconductor wafers, providing a barrier gas heat transfer media, and regulating backside cooling gas parameters during integrated circuit manufacturing processes.

SUMMARY OF THE INVENTION

In view of the foregoing disadvantages inherent in the known types of clamping devices now present in the prior art, the present invention provides a new piezoelectric wafer clamping system construction wherein the same can be utilized the purpose of securing semiconductor wafers, providing a barrier gas heat transfer media, and regulating backside cooling gas parameters during integrated circuit manufacturing processes.

The general purpose of the present invention, which will be described subsequently in greater detail, is to provide a new piezoelectric wafer clamping system apparatus and method which has many of the advantages of the clamping devices mentioned heretofore and many novel features that result in a new piezoelectric wafer clamping system which is not anticipated, rendered obvious, suggested, or even implied by any of the prior art clamping devices, either alone or in any combination thereof.

To attain this, the present invention generally comprises a plurality of piezoelectric stack assemblies designed for providing a vertical clamping force to a semiconductor wafer, an annular wafer clamp member coupled to each one of the plurality of piezoelectric stack assemblies and positionable to abut a top surface of a semiconductor wafer, a wafer support assembly designed for supporting the semiconductor wafer during processing, and a control assembly designed to monitor and compare actual cooling gas process parameters with preset process parameters and electronically regulate a vertical clamping force applied by the plurality of the piezoelectric stack assemblies.

There has thus been outlined, rather broadly, the more important features of the invention in order that the detailed description thereof that follows may be better understood, and in order that the present contribution to the art may be better appreciated. There are additional features of the invention that will be described hereinafter and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the foregoing abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

It is therefore an object of the present invention to provide a new piezoelectric wafer clamping system apparatus and method which has many of the advantages of the clamping devices mentioned heretofore and many novel features that result in a new piezoelectric wafer clamping system which is not anticipated, rendered obvious, suggested, or even implied by any of the prior art clamping devices, either alone or in any combination thereof.

It is another object of the present invention to provide a new piezoelectric wafer clamping system which may be easily and efficiently manufactured and marketed.

It is a further object of the present invention to provide a new piezoelectric wafer clamping system which is of a durable and reliable construction.

An even further object of the present invention is to provide a new piezoelectric wafer clamping system which is susceptible of a low cost of manufacture with regard to both materials and labor, and which accordingly is then susceptible of low prices of sale to the consuming public, thereby making such piezoelectric wafer clamping system economically available to the buying public.

Still yet another object of the present invention is to provide a new piezoelectric wafer clamping system which provides in the apparatuses and methods of the prior art some of the advantages thereof, while simultaneously overcoming some of the disadvantages normally associated therewith.

Still another object of the present invention is to provide a new piezoelectric wafer clamping system for the purpose of securing semiconductor wafers, providing a barrier gas heat transfer media, and regulating backside cooling gas parameters during integrated circuit manufacturing processes.

Yet another object of the present invention is to provide a new piezoelectric wafer clamping system which includes a plurality of piezoelectric stack assemblies designed for providing a vertical clamping force to a semiconductor wafer, an annular wafer clamp member coupled to each one of the plurality of piezoelectric stack assemblies and positionable to abut a top surface of a semiconductor wafer, a wafer support assembly designed for supporting the semiconductor wafer during processing, and a control assembly designed to monitor and compare actual cooling gas process parameters with preset process parameters and electronically regulate a vertical clamping force applied by the plurality of the piezoelectric stack assemblies.

Still yet another object of the present invention is to provide a new piezoelectric wafer clamping system that provides real-time control of clamping force and backside cooling gas pressure for semiconductor wafers during integrated circuit manufacturing processes.

Even still another object of the present invention is to provide a new piezoelectric wafer clamping system that can be used with existing wafer processing chambers.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be made to the accompanying drawings and descriptive matter in which there are illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein:

FIG. 3 is a schematic cross-sectional view of the piezoelectric stack assembly of the present invention.

FIG. 4 is a schematic perspective view of the annular wafer clamp member and piezoelectric stack assemblies of the present invention.

DESCRIPTION OF THE PREFERRED EMBODIMENT

Figure 1:
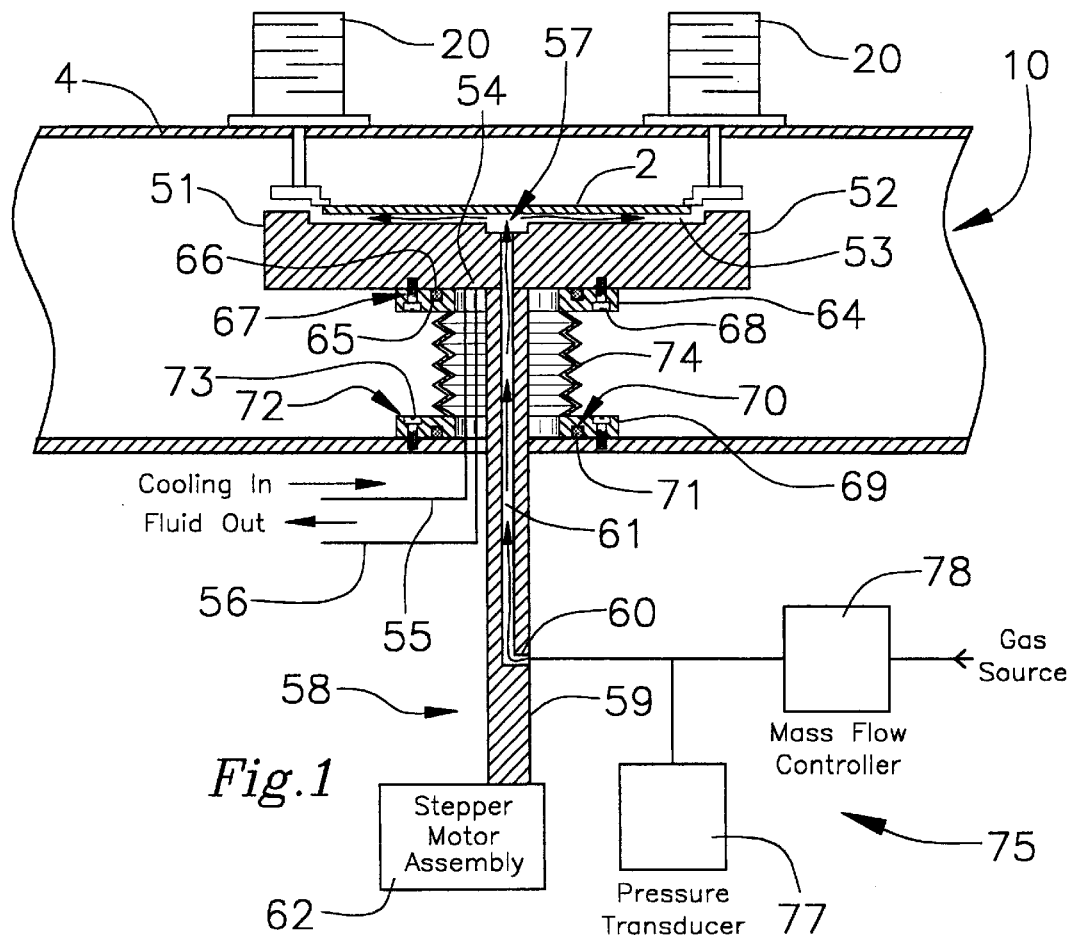
FIG. 1 is a schematic cross-sectional view of a new piezoelectric wafer clamping system according to the present invention.
Figure 2:
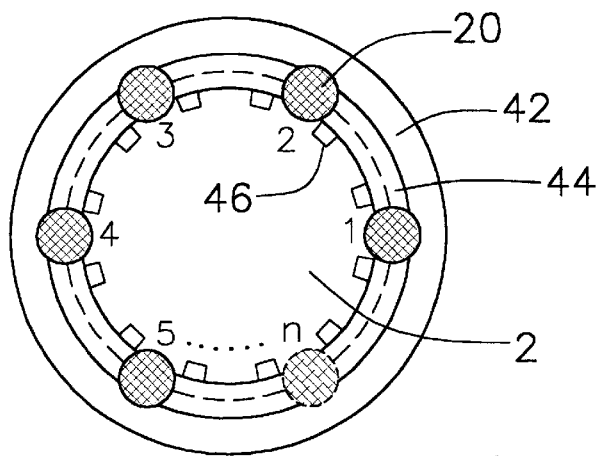
FIG. 2 is a schematic top view of the present invention.
Figure 5:
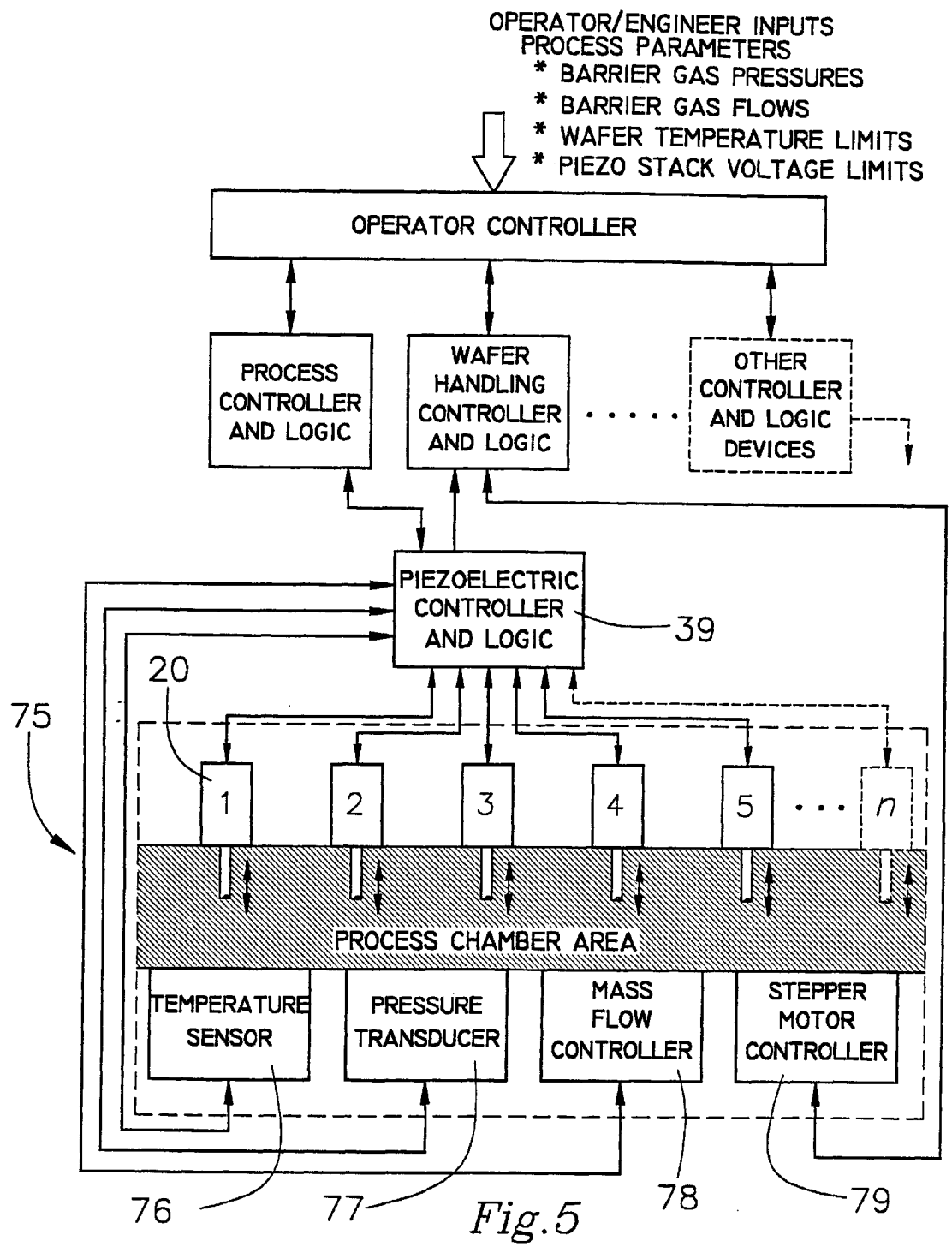
FIG. 5 is a schematic block diagram of the controller of the present invention.
Figure 6:
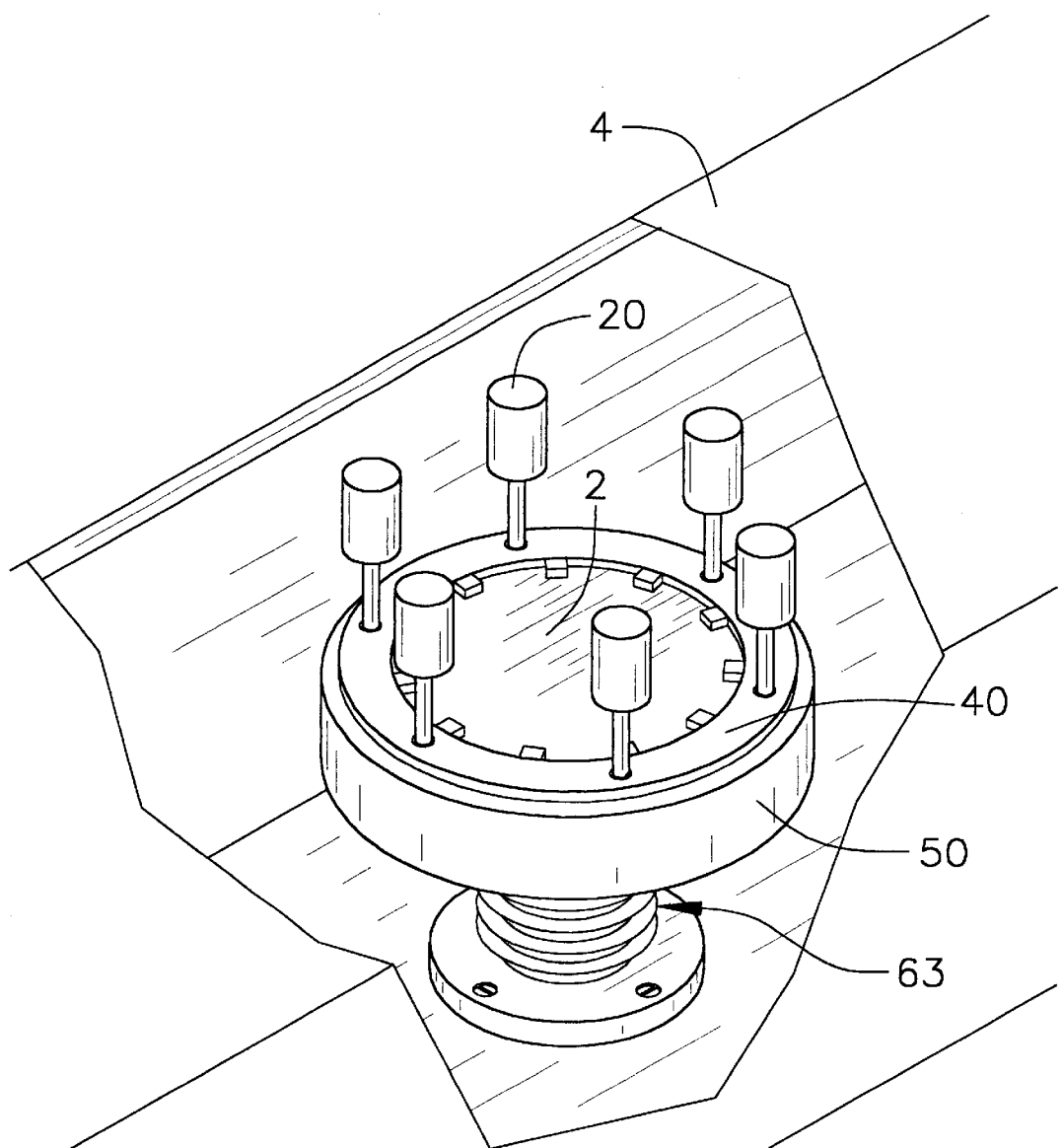
FIG. 6 is a perspective view of the present invention.

With reference now to the drawings, and in particular to FIGS. 1 through 6 thereof, a new piezoelectric wafer clamping system embodying the principles and concepts of the present invention and generally designated by the reference numeral 10 will be described.

As best illustrated in FIGS. 1 through 6, the piezoelectric wafer clamping system 10 generally comprises a plurality of piezoelectric stack assemblies 20, an annular wafer clamp member 40, a wafer support assembly 50, and a control assembly 75.

The plurality of piezoelectric stack assemblies 20 is designed for providing an adjustable vertical clamping force to a semiconductor wafer 2 thus regulating and controlling backside cooling gas pressure parameters.

The annular wafer clamp member 40 is coupled to each one of the plurality of piezoelectric stack assemblies 20. The annular wafer clamp 40 can be positioned to abut a top surface of a semiconductor wafer 2.

The wafer support assembly 50 is designed for supporting a semiconductor wafer 2 during processing. In addition, the wafer support assembly 50 provides vertical clearance for wafer handling and supplies backside cooling gas for semiconductor wafers 2.

The control assembly 75 is designed for regulating a clamping force applied by the plurality of piezoelectric stack assemblies 20 and the positioning of the annular wafer clamp member 40 based upon a plurality of control input signals.

Each one of the plurality of piezoelectric stack assemblies 20 further comprises a stack housing 22, a piezoelectric stack 30, a diaphragm member 34, and a stem member 36.

The stack housing 22 includes a substantially circular top wall 24. The stack housing 22 includes a perimeter wall 26, which extends downwardly from the top wall 24. The stack housing 22 includes a flange portion 28, which extends from a lower edge of the perimeter wall 26. The flange portion 28 is designed for coupling the stack housing 22 to a wall of a processing chamber 4.

The piezoelectric stack 30 is positioned within the stack housing 22. The piezoelectric stack 30 includes a first end 31 and a second end 32. The first end 31 abuts an interior surface of a top wall 24 of the stack housing 22.

The diaphragm member 34 is positioned substantially within an interior area defined by the perimeter wall 26. The diaphragm member 34 is positioned adjacent to the lower edge of the perimeter wall 26. The diaphragm member 34 is used for resiliently vacuum sealing the interior area.

The second end 32 of the piezoelectric stack 30 abuts a medial portion of the diaphragm member 34.

The stem member 36 includes a diaphragm end 37 and a clamp end 38. The diaphragm end 37 abuts the medial portion of the diaphragm member 34. The stem member 36 is substantially aligned with the piezoelectric stack 30 such that a vertical throw of the piezoelectric stack 30 moves the stem member 36. The clamp end 38 of the stem member 36 abuts the annular wafer clamp member 40 for transferring a clamping force generated by the piezoelectric stack 30 through the diaphragm member 34 and the stem member 36 to the annular wafer clamp member 40.

The stack housing 22 further comprises an annular groove 23 and an o-ring member 21.

The annular groove 23 is positioned on a lower surface of the flange portion 28. The annular groove 23 preferably is positioned substantially adjacent to the diaphragm member 34.

The o-ring member 21 is positioned substantially in the annular groove 23. The o-ring member 21 provides an environmental barrier between a vacuum interior of the processing chamber 4 and an external atmospheric environment.

The stack housing 22 further comprises a plurality of apertures 25 and a plurality of connecting members 27.

Each of the plurality of apertures 25 extends through the flange portion 28.

Each one of the connecting members 27 is positionable through an associated one of the apertures 25 for coupling the stack housing 22 to the processing chamber 4.

The annular wafer clamp member 40 further comprises a base portion 42, a lip portion 44, and a plurality of protrusions 46.

The base portion 42 is positioned to control a vertical spacing between said semiconductor wafer 2 and said wafer support assembly 50.

The lip portion 44 extends from the base portion 42 such that a bottom surface of the lip portion 44 is coplanar with a bottom surface of the base portion 42. The lip portion 44 is for engaging a perimeter edge portion of a semiconductor wafer 2 such that a clamping force is transferable to the semiconductor wafer 2.

The plurality of protrusions 46 extends from the lip portion 44. The plurality of protrusions 46 is positioned such that a top surface of the protrusions 46 is coplanar with a bottom surface of the lip portion 44. The plurality of protrusions 46 preferably is positioned in a substantially uniformly spaced relationship around an interior edge of the lip portion 44. The protrusions 46 provide additional contact surfaces for the wafer clamping member 40 with respect to the semiconductor wafer 2.

The wafer support assembly 50 further comprises a heatsink 51, a vertical adjustment assembly 58, and a bellows assembly 63.

The heatsink 51 is designed for providing a thermal sink for cooling the semiconductor wafer 2.

The vertical adjustment assembly 58 is used for controlling the initial height of the wafer support assembly 50.

The bellows assembly 63 is used for providing an environmental barrier between a vacuum interior of a processing chamber 4 and an external atmospheric environment.

The heatsink 51 further comprises a metal base 52 and a via 57.

The metal disk 52 includes a substantially circular depression 53 centered on a top surface of the metal disk 52. The metal disk 52 includes a cooling channel 54 routed through an interior portion of the metal disk 52. The cooling channel 54 includes an input portion 55 and an output portion 56 each extending from the metal disk 52.

The via 57 is positioned at a focus of the depression 53. The via 57 extends through the metal disk 52 for conducting a barrier gas through the metal disk 52. The barrier gas provides a heat transfer buffer between a semiconductor wafer 2 and the metal disk 52.

The vertical adjustment assembly 58 further comprises a vertical adjustment shaft 59 and a stepper motor assembly 62.

The vertical adjustment shaft 59 is coupled to a bottom surface of the heatsink 51. The vertical adjustment shaft 59 includes an aperture 60, which extends from a lower portion radially into the vertical adjustment shaft 59. The vertical adjustment shaft 59 includes a bore 61, which extends from a top edge downwardly to the aperture 60. The bore 61 and aperture 60 are for providing a gas to form a cooling gas barrier for the heatsink 51.

The stepper motor 62 is operationally coupled to the vertical adjustment shaft 59 such that the position of the vertical adjustment shaft 59 is controlled by the stepper motor 62.

The bellows assembly 63 further comprises an upper 64 and lower flange member 69, a bellows member 74, and a vertical adjustment assembly 58.

The upper flange member 64 is coupled to a bottom surface of the heatsink 51.

The lower flange member 69 coupled to a lower interior surface of a process chamber 4.

The bellows member 74 extends between the upper 64 and lower flange members 69. The bellows member 74 provides an environmental barrier between a vacuum interior of the process chamber 4 and an external atmospheric environment.

The vertical adjustment assembly 58 extends through the upper 64 and lower flanges 69 and the bellows member 74.

The upper flange member 64 further comprises an annular groove 65, an o-ring member 66, a plurality of apertures 67, and a plurality of connecting members 68.

The annular groove 65 is positioned on an upper surface of the upper flange member 64. The annular groove 65 is preferably positioned substantially adjacent to the bellows member 74.

The o-ring member 66 is positioned substantially in the annular groove 65. The o-ring member 66 provides an environmental barrier between a vacuum interior of the processing chamber 4 and an external atmospheric environment.

The plurality of apertures 67 extends through the upper flange member 64.

Each one of the connecting members 68 is positionable through an associated one of the apertures 67 for coupling the upper flange member 64 to the heatsink 51.

The lower flange member 69 further comprises an annular groove 70, an o-ring member 71, a plurality of apertures 72, and a plurality of connecting members 73.

The annular groove 70 is positioned on a lower surface of the lower flange member 69. The annular groove 70 is preferably positioned substantially adjacent to the bellows member 74.

The o-ring member 71 is positioned substantially in the annular groove 70. The o-ring member 71 provides an environmental barrier between a vacuum interior of the processing chamber 4 and an external atmospheric environment.

The plurality of apertures 72 each extends through the lower flange member 69.

Each one of the connecting members 73 is positionable through an associated one of the apertures 72 for coupling the lower flange member 69 to a lower interior surface of the processing chamber 4.

The control assembly 75 further comprises a temperature sensor 76, a pressure transducer 77, a mass flow controller 78, a stepper motor controller 79, and a piezoelectric controller 39.

The temperature sensor 76 is designed for monitoring the temperature of the semiconductor wafer 2. The temperature sensor 76 provides a first process monitoring input signal.

The pressure transducer 77 is designed for monitoring a back-pressure associated with a barrier gas buffering the semiconductor wafer 2 from the heatsink 51. The pressure transducer 77 provides a second process monitoring input signal.

The mass flow controller 78 is designed for controlling the initial rate of flow of the barrier gas. The mass flow controller 78 provides a third process monitoring input signal.

The stepper motor controller 79 is used for controlling the positioning of a vertical adjustment assembly 58. Thus the initial vertical position of the wafer support assembly 50 is controlled.

The piezoelectric controller 39 uses the first, second and third process monitoring input signals and a set of external input signals associated with the operational process parameters. The piezoelectric controller 39 is operationally coupled to the stepper motor controller 79 and the mass flow controller 78 such that the piezoelectric controller 39 controls the operation of the stepper motor controller 79 and the mass flow controller 78. The piezoelectric controller 39 compares the process monitoring input signals and the external inputs to adjust the vertical clamping force onto the semiconductor wafer via the piezoelectric stack assembly 20. The piezoelectric controller 39 compares the process monitoring and external inputs to electronically adjust the vertical clamping force onto the semiconductor wafer via the piezoelectric stack assembly 20.

As to a further discussion of the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

I claim:

1. A piezoelectric wafer clamping system comprising:
   a plurality of piezoelectric stack assemblies adapted for providing a vertical clamping force to a semiconductor wafer;
   a annular wafer clamp member coupled to each one of said plurality of piezoelectric stack assemblies, said annular wafer clamp being positionable to abut a top surface of a semiconductor wafer;
   a wafer support assembly adapted for supporting a semiconductor wafer during processing; and
   a control assembly adapted for regulating a clamping force applied by said plurality of piezoelectric stack assemblies and the positioning of said wafer support assembly based upon a plurality of control input signals;
   each one of said plurality of piezoelectric stack assemblies further comprises:
      a stack housing, said stack housing having a substantially circular top wall, said stack housing having a perimeter wall extending downwardly from said top wall, said stack housing having a flange portion extending from a lower edge of said perimeter wall, said flange portion being adapted for coupling said stack housing to a wall of a processing chamber;
      a piezoelectric stack positioned within said stack housing, said piezoelectric stack having a first end and a second end, said first end abutting an interior surface of a top wall of said stack housing;
      a diaphragm member positioned substantially within an interior area defined by said perimeter wall, said diaphragm member being positioned adjacent said lower edge of said perimeter wall, said diaphragm member resiliently sealing said interior area;
      said second end of said piezoelectric stack abutting a medial portion of said diaphragm member;
      a stem member having a diaphragm end and a clamp end, said diaphragm end abutting said medial portion of said diaphragm member, said stem member being substantially aligned with said piezoelectric stack such that a vertical throw of said piezoelectric stack moves said stem member, said clamp end of said stem member abutting said annular wafer clamp member for transferring a clamping force generated by said piezoelectric stack through said diaphragm member and said stem member to said annular wafer clamp member;
   said stack housing further comprises:
      an annular groove positioned on a lower surface of said flange portion, said annular groove preferably being positioned substantially adjacent to said diaphragm member;
      an o-ring member, said o-ring member being positioned substantially in said annular groove, said o-ring member providing an environmental barrier between an interior of the processing chamber and an external environment;
   said stack housing further comprises:
      a plurality of apertures extending through said flange portion;
      a plurality of connecting members, each one of said connecting members being positionable through an associated one of said apertures for coupling said stack housing to the processing chamber;
   said annular wafer clamp member further comprises:
      a base portion positionable to control a vertical spacing between said semiconductor wafer and said wafer support assembly,
      a lip portion extending from said base portion such that a bottom surface of said lip portion is coplanar with a bottom surface of said base portion, said lip portion being for engaging a perimeter edge portion of a semiconductor wafer such that a clamping force is transferable to the semiconductor wafer;
   said annular wafer clamp member further comprises:
      a plurality of protrusions extending from said lip portion, said plurality of protrusions being positioned such that a top surface of said protrusions is coplanar with a bottom surface of said lip portion, said plurality of protrusions preferably being positioned in a substantially uniformly spaced relationship around an interior edge of said lip portion, said protrusions providing additional contact surfaces for said wafer clamping member with respect to the semiconductor wafer;
   said wafer support assembly further comprises:
      a heatsink adapted for providing a thermal sink for cooling the semiconductor wafer;

a vertical adjustment assembly for controlling a height of said wafer support assembly; and a bellows assembly for providing an environmental barrier between an interior of a processing chamber and an external environment;

said heatsink further comprises:

an metal disk having a substantially circular depression centered on a top surface of said metal disk, said metal disk having a cooling channel routed through an interior portion of said metal disk, said cooling channel having an input portion and an output portion each extending from said metal disk;

a via positioned at a focus of said depression, said via extending through said metal disk for conducting a barrier gas through said metal disk, said barrier gas providing a heat transfer buffer between a semiconductor wafer and said metal disk;

said vertical adjustment assembly further comprises:

a vertical adjustment shaft coupled to a bottom surface of said heatsink, said vertical adjustment shaft having an aperture extending from a lower portion radially into said vertical adjustment shaft, said vertical adjustment shaft having a bore extending from a top edge downwardly to said aperture, said bore and aperture being for providing a gas to form a gas barrier for said heatsink;

a stepper motor operationally coupled to said vertical adjustment shaft such that the position of said vertical adjustment shaft is controlled by said stepper motor;

said bellows assembly further comprises:

a upper flange member coupled to a bottom surface of said heatsink;

a lower flange member coupled to a lower interior surface of a process chamber;

a bellows member extending between said upper and lower flange members, said bellows member providing an environmental barrier between an interior of said process chamber and an external environment;

said vertical adjustment assembly being extending through said upper and lower flanges and said bellows member;

said upper flange member further comprises:

an annular groove positioned on a upper surface of said upper flange member, said annular groove preferably being positioned substantially adjacent to said bellows member;

an o-ring member, said o-ring member being positioned substantially in said annular groove, said o-ring member providing an environmental barrier between an interior of the processing chamber and an external environment;

a plurality of apertures extending through said upper flange member;

a plurality of connecting members, each one of said connecting members being positionable through an associated one of said apertures for coupling said upper flange member to said heatsink;

said lower flange member further comprises:

an annular groove positioned on a lower surface of said lower flange member, said annular groove preferably being positioned substantially adjacent to said bellows member;

an o-ring member, said o-ring member being positioned substantially in said annular groove, said o-ring member providing an environmental barrier between an interior of the processing chamber and an external environment;

a plurality of apertures extending through said lower flange member;

a plurality of connecting members, each one of said connecting members being positionable through an associated one of said apertures for coupling said lower flange member to a lower interior surface of the processing chamber;

said control assembly further comprises:

a temperature sensor adapted for monitoring the temperature of the semiconductor wafer, said temperature sensor providing a first process monitoring input signal;

a pressure transducer adapted for monitoring a back-pressure associated with a barrier gas buffering the semiconductor wafer from the heatsink, said pressure transducer providing a second process monitoring input signal;

a mass flow controller adapted for controlling the rate of flow of the barrier gas, said mass flow controller providing a third process monitoring input signal;

a stepper motor controller for controlling the positioning of a vertical adjustment assembly whereby the vertical position of said wafer support assembly is controlled;

a piezoelectric controller, said piezoelectric controller using said first, second, and third process monitoring inputs and a set of external input signals associated with a process chamber, said piezoelectric controller being operationally coupled to said stepper motor controller and said mass flow controller such that said piezoelectric controller controlling the operation of said stepper motor controller and said mass flow controller.

2. A piezoelectric wafer clamping system comprising:

a plurality of piezoelectric stack assemblies adapted for providing a vertical clamping force to a semiconductor wafer;

an annular wafer clamp member coupled to each one of said plurality of piezoelectric stack assemblies, said annular wafer clamp member being positionable to abut a top surface of a semiconductor wafer;

a wafer support assembly adapted for supporting a semiconductor wafer during processing; and a control assembly adapted for regulating a clamping force applied by said plurality of piezoelectric stack assemblies and the positioning of said annular wafer clamp member based upon a plurality of control input signals.

3. The piezoelectric wafer clamping system of claim 2, wherein each one of said plurality of piezoelectric stack assemblies further comprises:

a stack housing, said stack housing having a substantially circular top wall, said stack housing having a perimeter wall extending downwardly from said top wall, said stack housing having a flange portion extending from a lower edge of said perimeter wall, said flange portion being adapted for coupling said stack housing to a wall of a processing chamber;

a piezoelectric stack positioned within said stack housing, said piezoelectric stack having a first end and a second end, said first end abutting an interior surface of a top wall of said stack housing;

a diaphragm member positioned substantially within an interior area defined by said perimeter wall, said diaphragm member being positioned adjacent said lower edge of said perimeter wall, said diaphragm member resiliently sealing said interior area;

said second end of said piezoelectric stack abutting a medial portion of said diaphragm member;

a stem member having a diaphragm end and a clamp end, said diaphragm end abutting said medial portion of said diaphragm member, said stem member being substantially aligned with said piezoelectric stack such that a vertical throw of said piezoelectric stack moves said stem member, said clamp end of said stem member abutting said annular wafer clamp member for transferring a clamping force generated by said piezoelectric stack through said diaphragm member and said stem member to said annular wafer clamp member.

4. The piezoelectric wafer clamping system of claim 2, wherein said stack housing further comprises:

an annular groove positioned on a lower surface of said flange portion, said annular groove preferably being positioned substantially adjacent to said diaphragm member;

an o-ring member, said o-ring member being positioned substantially in said annular groove, said o-ring member providing an environmental barrier between an interior of the processing chamber and an external environment.

5. The piezoelectric wafer clamping system of claim 2, wherein said stack housing further comprises:

a plurality of apertures extending through said flange portion;

a plurality of connecting members, each one of said connecting members being positionable through an associated one of said apertures for coupling said stack housing to the processing chamber.

6. The piezoelectric wafer clamping system of claim 2, wherein said annular wafer clamp member further comprises:

a base portion positionable to control a vertical spacing between said semiconductor wafer and said wafer support assembly, a lip portion extending from said base portion such that a bottom surface of said lip portion is coplanar with a bottom surface of said base portion, said lip portion being for engaging a perimeter edge portion of a semiconductor wafer such that a clamping force is transferable to the semiconductor wafer.

7. The piezoelectric wafer clamping system of claim 6, wherein said annular wafer clamp member further comprises:

a plurality of protrusions extending from said lip portion, said plurality of protrusions being positioned such that a bottom surface of said protrusions is coplanar with a bottom surface of said lip portion, said plurality of protrusions preferably being positioned in a substantially uniformly spaced relationship around an interior edge of said lip portion, said protrusions providing additional contact surfaces for said wafer clamping member with respect to the semiconductor wafer.

8. The piezoelectric wafer clamping system of claim 2, wherein said wafer support assembly further comprises:

a heatsink adapted for providing a thermal sink for cooling the semiconductor wafer;

a vertical adjustment assembly for controlling a height of said wafer support assembly; and a bellows assembly for providing an environmental barrier between an interior of a processing chamber and an external environment.

9. The piezoelectric wafer clamping system of claim 8, wherein said heatsink further comprises:

an metal disk having a substantially circular depression centered on a top surface of said metal disk, said metal disk having a cooling channel routed through an interior portion of said metal disk, said cooling channel having an input portion and an output portion each extending from said metal disk;

a via positioned at a focus of said depression, said via extending through said metal disk for conducting a barrier gas through said metal disk, said barrier gas providing a heat transfer buffer between a semiconductor wafer and said metal disk.

10. The piezoelectric wafer clamping system of claim 8, wherein said vertical adjustment assembly further comprises:

a vertical adjustment shaft coupled to a bottom surface of said heatsink, said vertical adjustment shaft having an aperture extending from a lower portion radially into said vertical adjustment shaft, said vertical adjustment shaft having a bore extending from a top edge downwardly to said aperture, said bore and aperture being for providing a gas to form a gas barrier for said heatsink;

a stepper motor operationally coupled to said vertical adjustment shaft such that the position of said vertical adjustment shaft is controlled by said stepper motor.

11. The piezoelectric wafer clamping system of claim 8, wherein said bellows assembly further comprises:

a upper flange member coupled to a bottom surface of said heatsink;

a lower flange member coupled to a lower interior surface of a process chamber;

a bellows member extending between said upper and lower flange members, said bellows member providing an environmental barrier between an interior of said process chamber and an external environment;

said vertical adjustment assembly being extending through said upper and lower flanges and said bellows member.

12. The piezoelectric wafer clamping system of claim 11 wherein said upper flange member further comprises:

an annular groove positioned on a upper surface of said upper flange member, said annular groove preferably being positioned substantially adjacent to said bellows member;

an o-ring member, said o-ring member being positioned substantially in said annular groove, said o-ring member providing an environmental barrier between an interior of the processing chamber and an external environment;

a plurality of apertures extending through said upper flange member;

a plurality of connecting members, each one of said connecting members being positionable through an associated one of said apertures for coupling said upper flange member to said heatsink.

13. The piezoelectric wafer clamping system of claim 11, wherein said lower flange member further comprises:

an annular groove positioned on a lower surface of said lower flange member, said annular groove preferably being positioned substantially adjacent to said bellows member;

an o-ring member, said o-ring member being positioned substantially in said annular groove, said o-ring member providing an environmental barrier between an interior of the processing chamber and an external environment;

a plurality of apertures extending through said lower flange member;

a plurality of connecting members, each one of said connecting members being positionable through an associated one of said apertures for coupling said lower flange member to a lower interior surface of the processing chamber.

14. The piezoelectric wafer clamping system of claim 2, wherein said control assembly further comprises:

a temperature sensor adapted for monitoring the temperature of the semiconductor wafer, said temperature sensor providing a first process monitoring input signal;

a pressure transducer adapted for monitoring a back-pressure associated with a barrier gas buffering the semiconductor wafer from the heatsink, said pressure transducer providing a second process monitoring input signal;

a mass flow controller adapted for controlling the rate of flow of the barrier gas, said mass flow controller providing a third process monitoring input signal;

a stepper motor controller for controlling the initial positioning of a vertical adjustment assembly whereby the vertical position of said wafer support assembly is controlled;

a piezoelectric controller, said piezoelectric controller using said first, second, and third process monitoring input signals and a set of external input signals associated with operational process parameters, said piezoelectric controller being operationally coupled to said stepper motor controller and said mass flow controller such that said piezoelectric controller controlling the operation of said stepper motor controller and said mass flow controller.

\* \* \* \* \*